(12) United States Patent
Yoneda

(10) Patent No.: US 7,243,187 B2
(45) Date of Patent: Jul. 10, 2007

(54) DATA RETRIEVAL DEVICE

(75) Inventor: Masato Yoneda, Chiba (JP)

(73) Assignee: Sony Corporation (JP)

( * ) Notice: Subject to any disclaimer, the term of this patent is extended or adjusted under 35 U.S.C. 154(b) by 478 days.

(21) Appl. No.: 10/715,352

(22) Filed: Nov. 19, 2003

(65) Prior Publication Data

US 2004/0103236 A1    May 27, 2004

(30) Foreign Application Priority Data

Nov. 20, 2002  (JP)  ............................ P2002-337202
Sep. 19, 2003  (JP)  ............................ P2003-328406

(51) Int. Cl.
G06F 12/00    (2006.01)
G06F 12/02    (2006.01)

(52) U.S. Cl. ....................................................... 711/108

(58) Field of Classification Search ...................... None
See application file for complete search history.

(56) References Cited

U.S. PATENT DOCUMENTS 6,745,280 B2 *    6/2004   Darnell et al. ............... 711/108
2002/0181263 A1 *  12/2002   Yanagawa ..................... 365/49

* cited by examiner

*Primary Examiner*—Sanjiv Shah
*Assistant Examiner*—Midys Rojas
(74) *Attorney, Agent, or Firm*—Rader Fishman & Grauer PLLC; Ronald P. Kananen

(57) ABSTRACT

A data retrieval device capable of attaining a low power consumption while utilizing high speed retrieving characteristics of a CAM, wherein a plurality of rule data with determined priority is newly arranged in an order of the size and assigned to memory blocks in accordance with the order, information on the assigned data range is stored in a register, the rule data is rearranged again in the priority order in each memory block, a range comparator compares input retrieval data with a content held in the register and a memory block to be retrieved is specified by the result, and a block controller activates only the specified block at the time of retrieving and not activating other blocks, so that a power consumption at the time of retrieving is reduced for that amount.

16 Claims, 8 Drawing Sheets

1-1~1-3···MEMORY BLOCK
21···COMPARISON SPECIFYING UNIT
22A···POINTER
(STORAGE DATA RANGE INDICATION REGISTER)
23···BLOCK CONTROLLING UNIT

SK: RETRIEVAL DATA
SC: RESULT OF RETRIEVING

FIG. 7

|  | BLOCK1 | BLOCK2 | BLOCK3 | BLOCK4 |
|---|---|---|---|---|
| TABLE1 | 1 | 1 | 0 | 0 |
| TABLE 2 | 0 | 1 | 1 | 0 |
| TABLE 3 | 0 | 0 | 1 | 1 |
| TABLE 3 | 1 | 0 | 0 | 0 |
| TABLE 4 | 0 | 1 | 0 | 0 |
| TABLE 5 | 0 | 0 | 1 | 0 |
| TABLE 6 | 0 | 0 | 0 | 1 |

DATA RETRIEVAL DEVICE

BACKGROUND OF THE INVENTION

1. Field of the Invention

The present invention relates to a data retrieval device operating at a high speed with a low power consumption.

2. Description of the Related Art

Along with a development of the Internet, there has been a demand for retrieving and comparing rule data determined in advance with packet data at a high speed for attaining high speed path retrieving and securing of security of a packet. Due to the demand, a content addressable memory (CAM) capable of retrieving data at a high speed has become an essential device (refer to, for example, the Japanese Unexamined Patent Publication No. 2001-236790).

The Japanese Unexamined Patent Publication (Kokai) No. 2001-236790 discloses a content addressable memory having a plurality of physical banks storing different data in accordance with kinds of CAMs, such as a binary CAM having data of only "0" and "1" and a ternary CAM having "X (don't care)" data in addition to the binary data, and a difference of bit lengths.

A currently prevailing CAM is called a ternary CAM wherein one data is composed of a plurality of bit data and each bit can store three kinds, "0", "1" and "* (don't care)". The stored data (rule data) and retrieval data (packet data) input from the outside are compared by every bit. When a bit in the stored data is "0 (or 1)" and a corresponding bit of the retrieval data is "0 (or 1)", the comparison result is matched, while when the retrieval data is "1 (or 0)", the result is not matched. The "* (don't care)" matches with both "0" and "1" of the retrieval data. This comparison is made on all bits composing the data, and the stored data and the retrieval data are considered to be matched only when all of the data was matched.

Also, since there is a case where the data stored in the CAM and the retrieval data from the outside match more than one, there is a priority circuit for outputting in an ascending (descending) order of the stored address. Normally, it is configured to output only data having the smallest address among the matched data. Accordingly, when creating rule data, significant rule data is stored in an ascending order of the address. An example thereof is shown in FIG. 2.

In FIG. 2, for simplification, stored rule data 100 is largely divided to three 4-bit data regions (A, B and C), and each rule data is stored at a position of a stored address 101 in accordance with the priority order of the rule data (in the figure, a priority tag 102 indicating the order is added to facilitate understanding, but it does not actually exist). Also, a mark "* (4 bits are expressed by one mark in the figure)" in the stored rule data 100 indicates that the value can be any. Furthermore, for example, "2–4" indicates that the data expressing a region from "2" to "4". In actuality, for specifying such a range, values of respective bits of the stored rule data 100 are made to be suitable values and one rule is expressed by a plurality of stored rule data 100 in some cases; but this time, for simplification, it is assumed that one rule can be expressed by one stored rule data 100.

However, a content addressable memory of the related art is configured to have a comparison circuit for every stored data stored therein and compares retrieval data from the outside with all stored data at a time. Therefore, extremely high-speed retrieving becomes possible, but since all comparison circuits operate at a time, an extremely large power is necessarily consumed. Naturally, a data transmission apparatus using the device becomes capable of transferring data at a high speed, but the large power consumption is a disadvantage. The above Japanese Unexamined Patent Publication No. 2001-236790 does not mention such comparison circuits, and it is considered that it applies a general configuration provided that it is not specifically mentioned, the same disadvantage is shared thereby.

For example, the CAM shown in FIG. 2 can store the rule data effectively and retrieve the data from the outside at an extremely high speed, but the power consumption is extremely large. This is because of comparing all the stored rule data with the retrieval data at a time. Furthermore, it is because of the characteristics of the priority circuit of the CAM that the more significant rule is stored at a position with the smaller (or the larger) address, and it is difficult to specify an area wherein a rule matching with retrieval data from the outside exists in advance. Therefore, it is required to perform a matching comparison on all rule data, so that a large power is consumed for performing the matching comparison.

The disadvantage to be solved in the present invention is the fact that a power consumption is large because of comparing the retrieval data from the outside with the all stored data, and this hinders realization of a large scale data retrieval device at a high speed.

SUMMARY OF THE INVENTION

An object of the present invention is to provide a data retrieval device operating at a high speed with a low power consumption.

To attain the above object, according to the present invention, there is provided a data retrieval device, comprising a rearrangement means for rearranging a first data group including a plurality of rule data arranged in an order of a first processing significance degree, in an order of a second processing significance degree; and an assignment means for assigning a new second data group rearranged in an order of said second processing significance degree by the rearrangement means to a plurality of memory blocks successively in an order from smaller (larger) second processing significance degrees; wherein when storing data assigned by said assignment means to said memory blocks, data assigned to said each memory block is furthermore rearranged in an order of said first processing significance degree by said rearrangement means and stored.

In the present invention, preferably, a storage data range indication register for indicating a range that includes data of at least one said memory block in an order of said second processing significance degree is provided.

In this case, furthermore preferably, a comparison specifying unit for comparing said storage data range indication register with input retrieval data and specifying a memory range including a memory block storing data to be compared with the input retrieval data based on the comparison result and a block controlling unit for activating at the time of retrieving a memory block storing said data to be compared from said plurality of memory blocks based on the specification result of said comparison specifying unit are provided.

Alternately, when the storage data range indication register is provided, preferably, a block specifying register for holding a combination of one or a plurality of memory blocks among said plurality of memory blocks by relating to reference numbers and a block controlling unit for activating said memory block in accordance with a value stored in said block specifying register are provided.

In the data retrieval device of the present invention, when the first data group including a plurality of rule data wherein the first processing significance degree is determined is input, the first data group is newly rearranged in an order of the second processing significance degree by the rearrangement means. The assignment means successively assigns the second data group rearranged in the second processing significance degree order to the plurality of memory blocks from the smaller (or the larger) ones in the second processing significance degree order. The second data group is again rearranged in the first processing significance degree order in a unit of data assigned to each memory and stored in each memory block.

In the data retrieval device configured as above, which memory block should be searched is known in accordance with input retrieval data. Namely, when the corresponding relationship of the second processing significance degree and the memory block is held in the storage data range indication register, a memory block to be activated by the block controlling unit can be specified by comparing the held content with the input retrieval data by the comparison specifying unit or by checking a content held by the block specifying register based on the reference number. Accordingly, it becomes possible to control to activate only one or a plurality of memory blocks including the memory block having the same content data as the retrieval data at the time of retrieving. At this time, other memory blocks are not activated.

By configuring a data retrieval device having the configuration of the present invention, the large disadvantage of a large power consumption in a CAM of the related art can be suppressed. As a result, an original structure of stored data of the CAM can be freely changed and a high speed CAM with a small power consumption realizing high speed retrieving can be realized.

BRIEF DESCRIPTION OF DRAWINGS

These and other objects and features of the present invention will become more clear from the following description of the preferred embodiments given with reference to the attached drawings, in which:

FIG. 7 is a table showing an example of corresponding relationships of table numbers and blocks in the second embodiment.

DESCRIPTION OF THE PREFERRED EMBODIMENT

First Embodiment

The first embodiment relates to a data retrieval device.

A data retrieval device in the embodiments of the present invention is realized by a semiconductor memory integrated circuit, a module and a substrate mounted with the integrated circuit, or an electronic device, etc. housing the same in a chassis. Below, embodiments will be explained by focusing on a content addressable memory (CAM) as a key part of the data retrieval device of the present invention.

Figure 1:
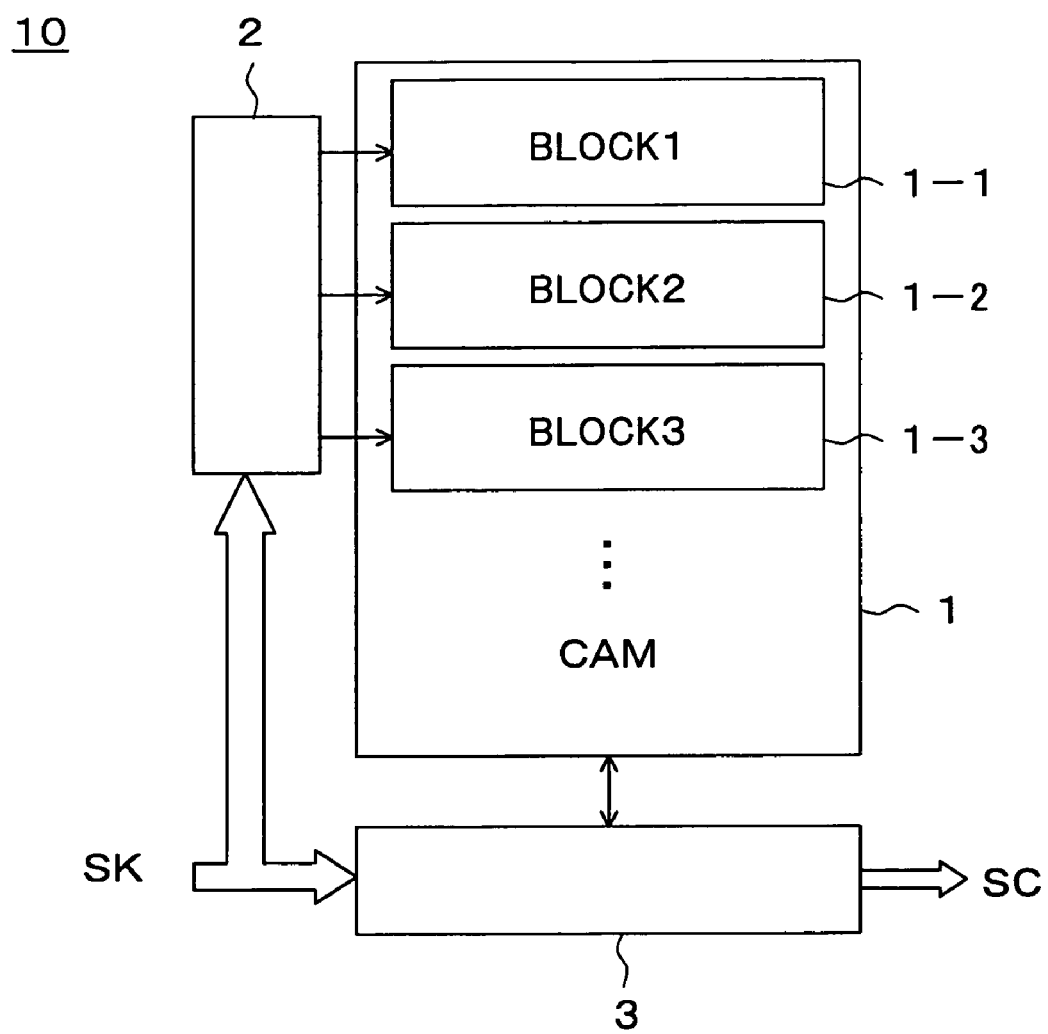
FIG. 1 is a block diagram of the schematic configuration of a first embodiment.

FIG. 1 is a block diagram of the schematic configuration of the CAM. The CAM 10 shown in FIG. 1 comprises a CAM unit 1 composed of a plurality of memory blocks 1-1, 1-2, 1-3, . . . , a block selection control unit 2 for activating any one of the memory blocks, and a retrieval control unit 3.

The block selection control unit 2 has the functions of "a comparison specifying unit" and "a block controller" of the present invention. The retrieval control unit 3 is a memory peripheral circuit for performing necessary controlling for data retrieving and comprises a circuit for selecting and driving a variety of signal lines, such as bit lines, bit auxiliary lines and match lines, a data buffer circuit at the time of writing and reading, and a power source circuit, etc., not illustrated. Also, in accordance with need, the retrieval control unit 3 includes a masking function for removing a part of bits of retrieval data (SK) from a comparison subject. Furthermore, the retrieval control unit 3 has a function of "rearrangement means" for rearranging stored rule data (first data group) input in an order of first processing significance degree to a second processing significance decree (for example, an order of the size of data values). The retrieval control unit 3 also has a function of "assignment means" for assigning a data group (a second data group) arranged by the second processing significance degree successively to the plurality of memory blocks 1-1, 1-2, 103, . . . in an order of the second processing significance degree. Note that the "rearrangement means" and the "assignment means" may be realized by one block or respectively separated function blocks. Alternately, a function of the "assignment means" may be included in the block selection control unit 2.

A detailed explanation will be made later on, but control of storing rule data in a memory will be briefly explained here.

The above "rearrangement means" rearranges the first data group to be a second data group, and the above "assignment means" determines a data range in the second data group to be stored in respective memory blocks successively by following the order of the second processing significance degree. As will be explained later on, information indicating a relation of the data range and the memory block is stored, for example, in a "storage data range indication register" in the block selection control unit 2. After that, when writing the second data group to the actual memory blocks, the "rearrangement means" again rearranges by the first processing significance degree as the original order in unit of a data in each memory block assigned in an order of the second processing significance degree. Therefore, data stored in the respective memory block by the retrieval control unit 3 is sectionalized by ranges of the second processing significance degree when perceiving by large memory blocks, but arranged in an order of the first processing significance degree in the respective memory blocks.

Below, data arrangement and storage and control at data retrieving will be explained in detail. The data storage structure of the related art made by following the first processing significance degree will be explained first, then the embodiments of the present invention will be explained by comparing with the same.

Figure 2:
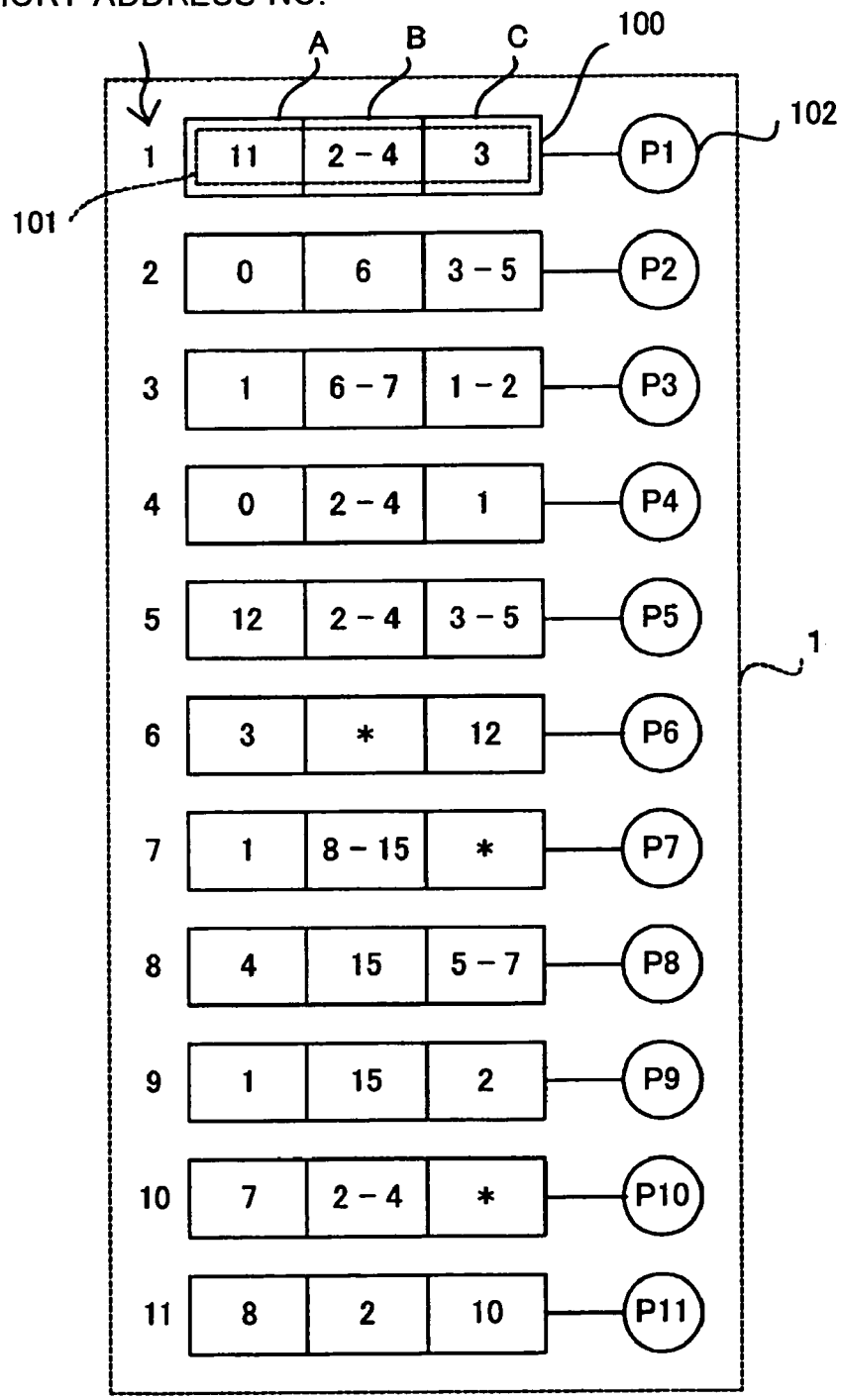
FIG. 2 is a view of a general data storing method as a comparative example of a data storing method of the first embodiment.

FIG. 2 shows the data storage structure of the related art. In the present example, there are 11 storage rule data and the rule data is divided to three regions A, B and C, each composed of 4 bits.

Rule data 100 having the highest priority (the data added with a priority tag 102 indicating P1 in FIG. 2) is stored at the first address, wherein A is 11, B is 2–4 and C is 3. Rule data 100 having the second priority (the data added with a priority tag 102 indicating P2 in FIG. 2) is stored at the second address, wherein A is 0, B is 6 and C is 3–5. Also, rule data 100 having the lowest priority (the data added with a priority tag 102 indicating P11 in FIG. 2) is stored at the eleventh address, wherein A is 8, B is 2 and C is 10.

As is understood from this example, when regarding the A, B and C as a series of data, the rule data 100 having the highest priority indicates the size of a range of 110203 to 110403, the rule data 100 having the second priority indicates a range of 000603 to 000605, and the rule data 100 having the eleventh priority indicates 080210. On the other hand, the stored rule data is compared with retrieval data from the outside, and at that time, all comparison circuits of all stored rule data are operated in the CAM of the related art.

The reason why all stored rule data 100 have to be compared as such is that the stored rule data 100 is not arranged by following a certain general order (size of data, etc.) and relationships between the retrieval data SK and the stored rule data 100 are completely unknown.

Thus, in the present invention, CAM data is structured so that a certain relationship between the stored rule data 100 and the retrieval data SK can be found and an accessible portion is limited to attain a low power consumption.

Figure 3:
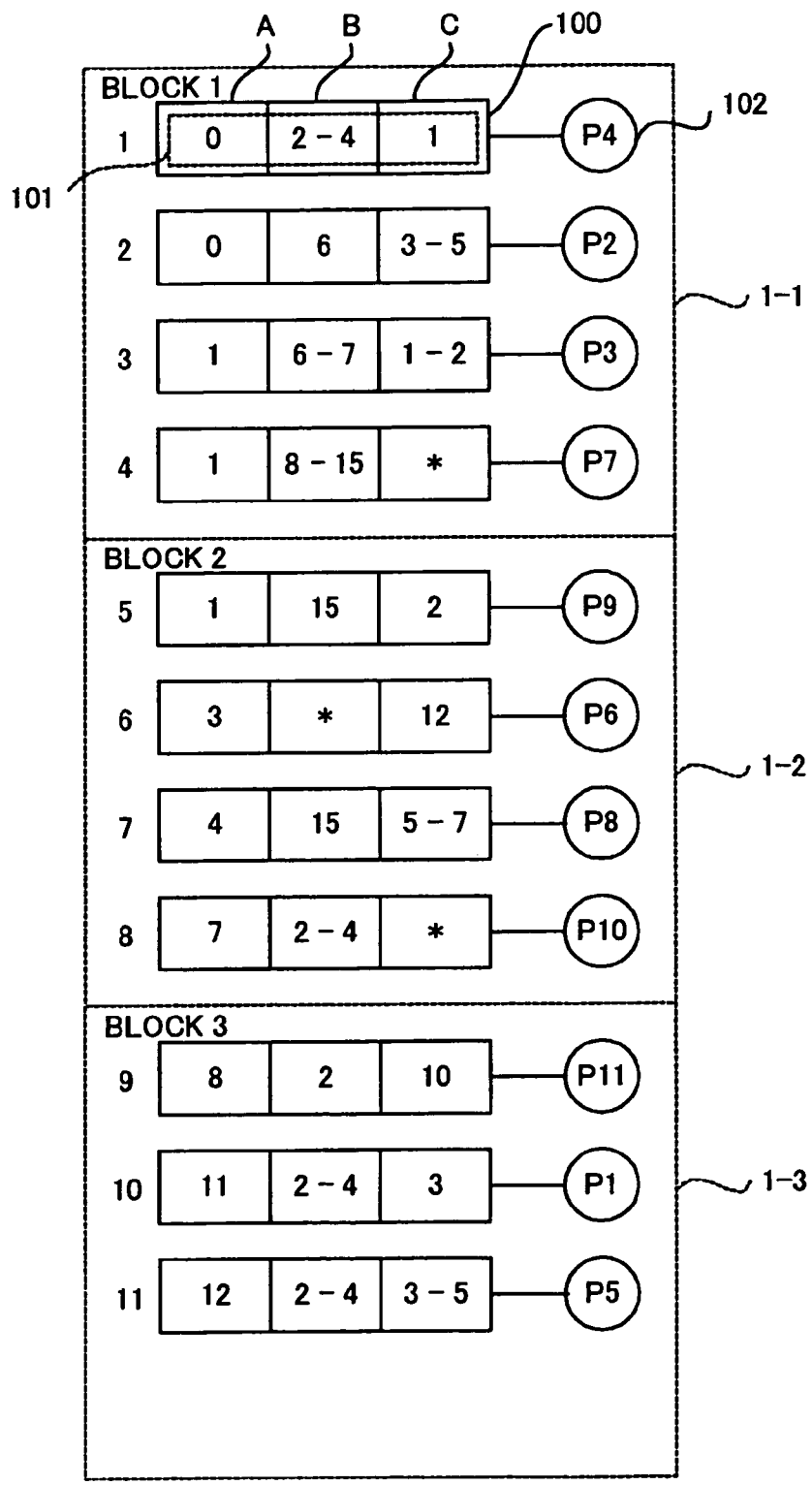
FIG. 3 is a view of a data storing method of the first embodiment.

As general orders, a size of data is typical. FIG. 3 shows what is obtained by arranging in an order of the size first and reassigned by four to each memory block (hereinafter, simply referred to as a block) by the above "rearrangement means". When arranged in a size order, the priority order of the original rule data 100 is not maintained. However, a range of the rule data 100 stored in the respective block becomes clear. For example, a data range of the block 1 is from "000201 (rule data with a priority tag P4) to "011531 (rule data with a priority tag P7), a data range of the block 2 is from "011502 (rule data with a priority tag P9) to "070431 (rule data with a priority tag P10), and a data range of the block 3 is from "080210 (rule data with a priority tag P11) to "120405 (rule data with a priority tag P5).

However, a problem appears on the boundary of the block 1 and the block 2. Namely, the rule data with the priority data P7 has an own range and expressing data from "010800" to "011531". On the other hand, the rule data with the priority tag of P7 may be smaller than the rule data with the priority tag of P9 in some cases and larger than that in other cases.

In such cases, largely two expressing methods are considered the rule data that should be treated as which block data. Data ranges of the respective blocks at this time become as below.

(1) Method by Dividing

In the case where the block 1 is stored with up to "011501" in the rule data with the priority tag of P7, the block 2 is stored with "011502" to "011531" by disassembling, the data range of the block 1 is from "000201" to "011501 (a part of the rule data with the priority tag of P7)", the data range of the block 2 is from "011502 (a part of the rule data with the priority tag of P7)" to "070431", and the data range of the block 3 is "080210" to "120405".

(2) Method Not by Dividing

In the case where the block 1 stores all of the rule data with the priority tag of P7, i.e., "010800" to "011531", and the block 2 stores "011502" and after that of the rule data of the priority tag of P9, a data range of the block 1 is from "000201" to "011531", a data range of the block 2 is from "011502" to "070431" and a range of the block 3 is from "080210" to "120405".

It should be noted that ranges of data are overlapped between the block 1 and the block 2 at this time.

Figure 4:
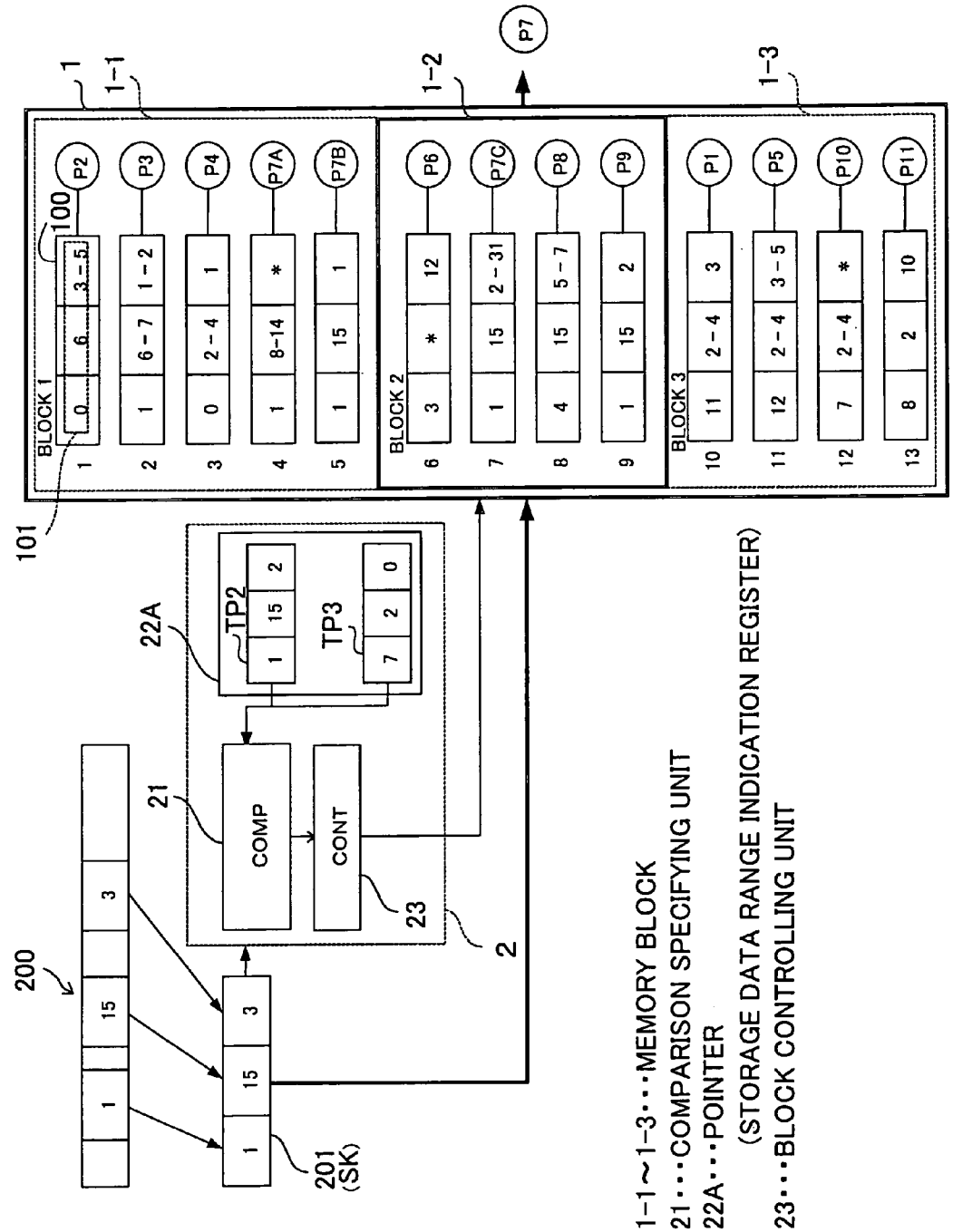
FIG. 4 is a view of the configuration of a block selection control unit and an example of data storing in the first embodiment.

FIG. 4 shows a rule data storing state in the case of the method by dividing described in the above (1). The rule data with the priority tag of P7 expressed in the block 1 indicates a range from "010800" to "011501" (P7A and P7B in FIG. 4). Also, the rule data with the priority tag of P7 expressed in the block 2 indicates a range from "011502" to "011531" (P7C in FIG. 4). In each block, data is arranged based on the original priority of the original rule data.

How matching retrieval with the retrieval data from the outside is performed in this state will be explained. In FIG. 4, a pointer 22A composing an embodiment of a "storage data range indication register" of the present invention is provided. First, in this example, for indicating data ranges of the memory blocks (the block 1 to block 3), a data top pointer TP2 of the block 2 in the pointer 22A is input the minimum data "011502", and a data top pointer TP3 of the block 3 in the pointer 22A is input the minimum data "070200" in advance.

A value of retrieval data (SK) input from the outside is assumed to be "011503". The data is input to a range comparator 21, compared with the data top pointers TP2 and TP3, and the range is judged to be a range of the block 2 of the storage rule data. Note that the range comparator 21 composes an embodiment of a "comparison specifying unit" of the present invention.

From the judgment result, a block controller 23 activates only the block 2. Then, retrieving starts on the activated memory block by using the retrieval data (SK). A retrieving range to be activated is limited, which has been impossible in the related art, and retrieving at a high speed and a low power consumption by the CAM becomes possible.

Figure 5:
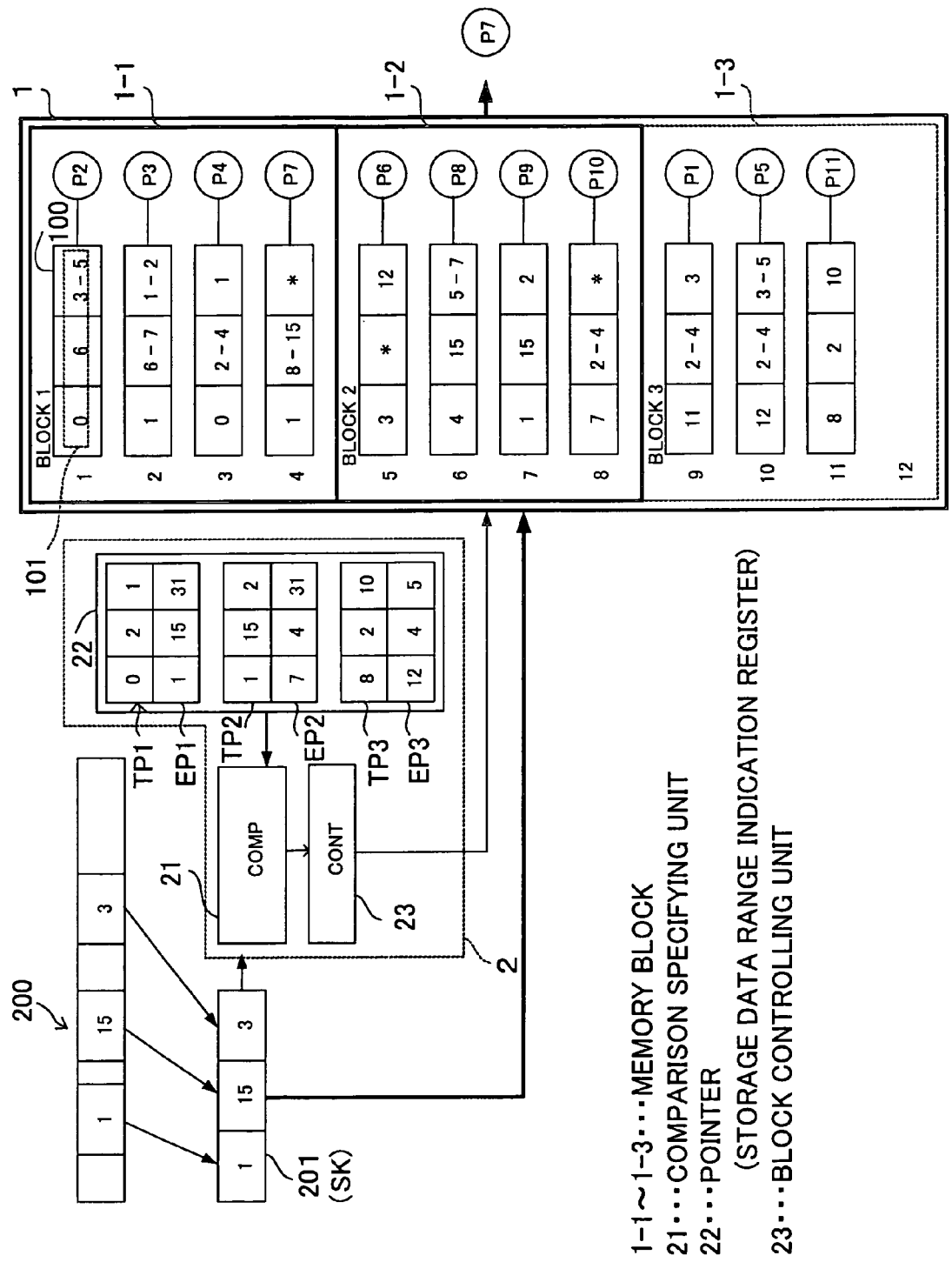
FIG. 5 is a view of another configuration of a block selection control unit and an example of data storing in the first embodiment.

Also, as a method of assigning data to respective blocks of the storage rule data regions, in the case of the above (2) wherein data ranges are overlapped, as shown in FIG. 5, in the register 22 indicating a storage data range of the block, two pointer values, that is, a top pointer value TP and an end pointer value EP, are provided for every block. A combination of the respective top pointer values TP and the end pointer values EP are TP1 (0,2,1) and EP1 (1,15,31) for the block 1, TP2 (1,15,2) and EP2 (7,4,31) for the block 2, and TP3 (8,2,10) and EP3 (12,4,5) for the block 3.

In the same way as in the above (1), first, the retrieval data (SK) 201 is compared with values of the top pointer and the end pointer of each block by the range comparator. When assuming that the retrieval data is "011503", a retrieval subject range is the block 1 and the block 2, and the block 1 and the block 2 are controlled as regions to be activated at the time of retrieving. At this time, since the rule data with the priority tag of P7 that should be matched is stored in the block 1, it is matched in the block 1.

As explained above, since the range of the rule data with the priority tag of P7 is from "010800" to "011531", in the case where there is a smaller range or a larger range than the rule data with the priority tag of P9, in order to use a simple CAM priority encoder (not shown) for outputting those with small addresses, it is important to arrange those having high priority in terms of the original rule in upper blocks (block with a small address). Also, it is of course possible to design a priority encoder circuit to judge and control special priority.

While not particularly described in the above explanation, a CAM is generally composed of a semiconductor integrated circuit, and the configuration installed inside the IC may be only a CAM unit 1 at least composed of a plurality of blocks, and in accordance with need, that is, as the configuration that should be included in a memory peripheral circuit in terms of easy controlling, for example, it is preferable to install a block controller 23 on the IC. In any cases, according to the present embodiment, only necessary blocks among the plurality of blocks composing the CAM unit 1 are activated, so that a power consumption of the CAM IC can be reduced.

Second Embodiment

In the above first embodiment, information relating to a data storage place held by a pointer as a comparison specifying unit was in a range of a data size.

In the second embodiment, as information relating to the data storage places, the case where other than a range of a data size can be used will be explained.

Figure 6:
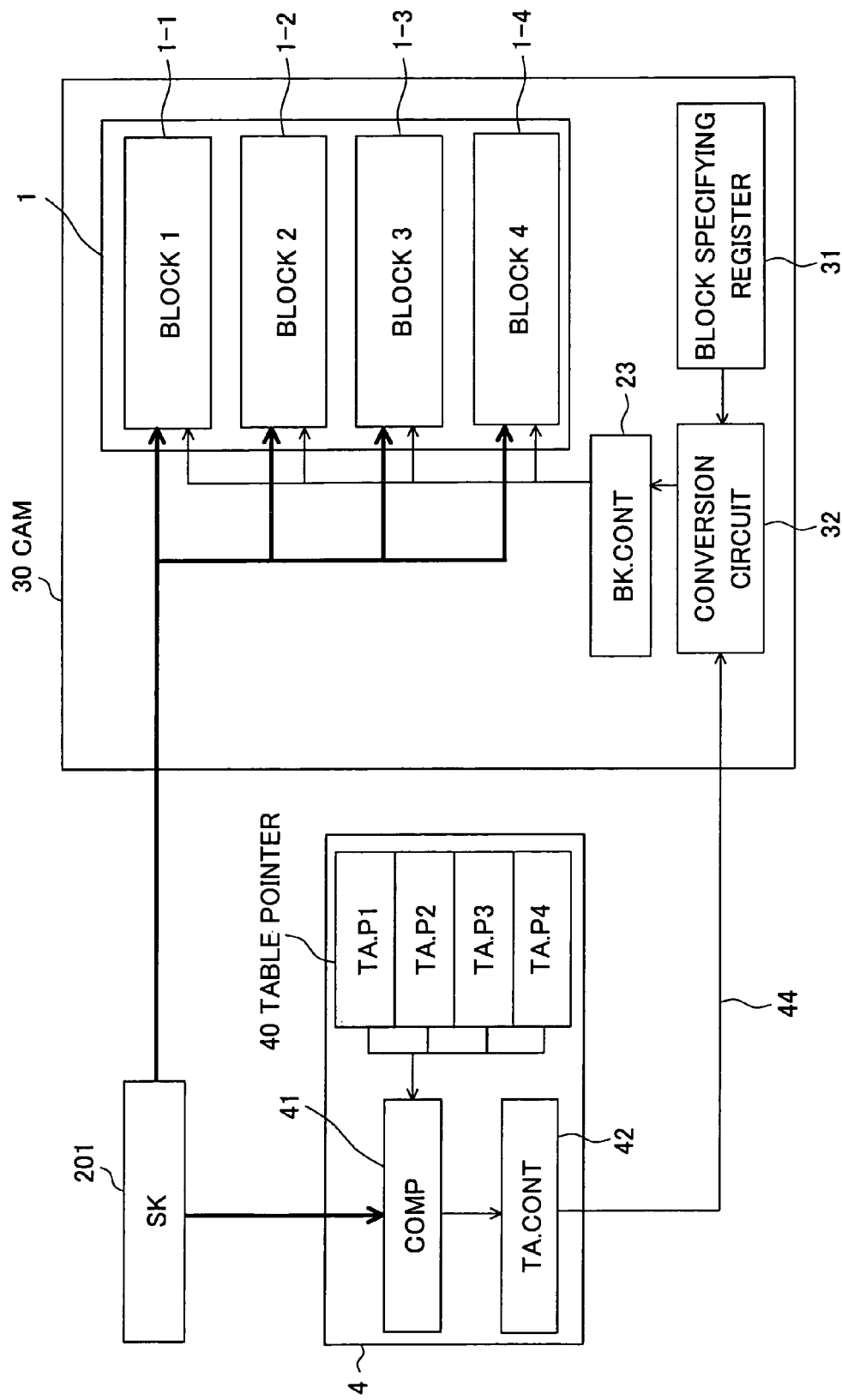
FIG. 6 is a block diagram of a data retrieval device of a second embodiment of the present invention.

FIG. 6 is a block diagram of a data retrieval device according to the second embodiment. Note that the overall configuration view of FIG. 1 is in common with that of the present embodiment.

The data retrieval device comprises in a CAM 30 a CAM unit 1 including a plurality of memory blocks (blocks) 1-1 to 1-4 and a block controlling unit, for example, a block controller 23, in the same way as in the first embodiment. The configuration of respective blocks in the CAM unit 1, a method of storing data in blocks, and a method of dividing in the case where data is included over a plurality of blocks are the same as those in the first embodiment, and the explanation will be omitted here.

In the present embodiment, as an example of information relating to data storage places in the CAM 30, a block specification register 31 for defining a corresponding relationship of a table number and a block number is provided. The table number and the block number correspond to a "reference number" of the present invention. Also, a conversion circuit 32 compares the table number input from the outside with the register content and converts to identification information of a block corresponding to the table number. Then, the block controller 23 activates only one or more blocks indicated by the identification information of the block.

FIG. 7 is a table showing corresponding relationships of table numbers and blocks by taking an example of storing data of the block specification register 31.

In FIG. 7, in "table 1", block number values of the blocks 1 and 2 are 1 and other than those are 0. This indicates that only block 1 and block 2 belong to the table 1. Each block basically belongs to one table, but as shown in the figure, it is possible to belong to a plurality of tables. Also, the configuration of each table and the number of blocks are not particularly limited.

Outside of the CAM 30, there is provided a table selection controller 4 for specifying a table to be selected based on input retrieval data (SK) 201. The table selection controller 4 comprises a table pointer 40, a table comparator 41 and a table controller 42.

The table pointer 40 stores a plurality of pointer values TA. P1 to Ta. P4, and outputs the pointer storage content to the table comparator 41 in accordance with a request by the table comparator 41. The table comparator 41 compares input retrieval data with the read pointer storage content and specifies a table number storing the storage data in the CAM unit to be compared with the retrieval data. The table controller 42 converts the table number to a form suitable to an output bus 44 and makes the same output.

The table number sent from the output bus 44 is input to the conversion circuit 32. The conversion circuit 32 refers to a block specifying register 31 holding a defined content of the table number and a block and specifies a block to be activated from the input table number. When identification information of a block is input to the block controller 23 from the conversion circuit 32, being controlled by the block controller 23, one or a plurality of blocks including at least storage data to be compared with retrieve data is activated. After that, data retrieving is performed in the same way as in the first embodiment and the retrieval result is output from the CAM 30.

In the second embodiment, there is an advantage that a power consumption of the CAM itself can be reduced by specifying a data storage range outside of the CAM. Also, a method of specifying a data storage range from a different viewpoint from that of the first embodiment becomes possible.

Note that the present embodiment can be combined with the first embodiment.

Figure 8:
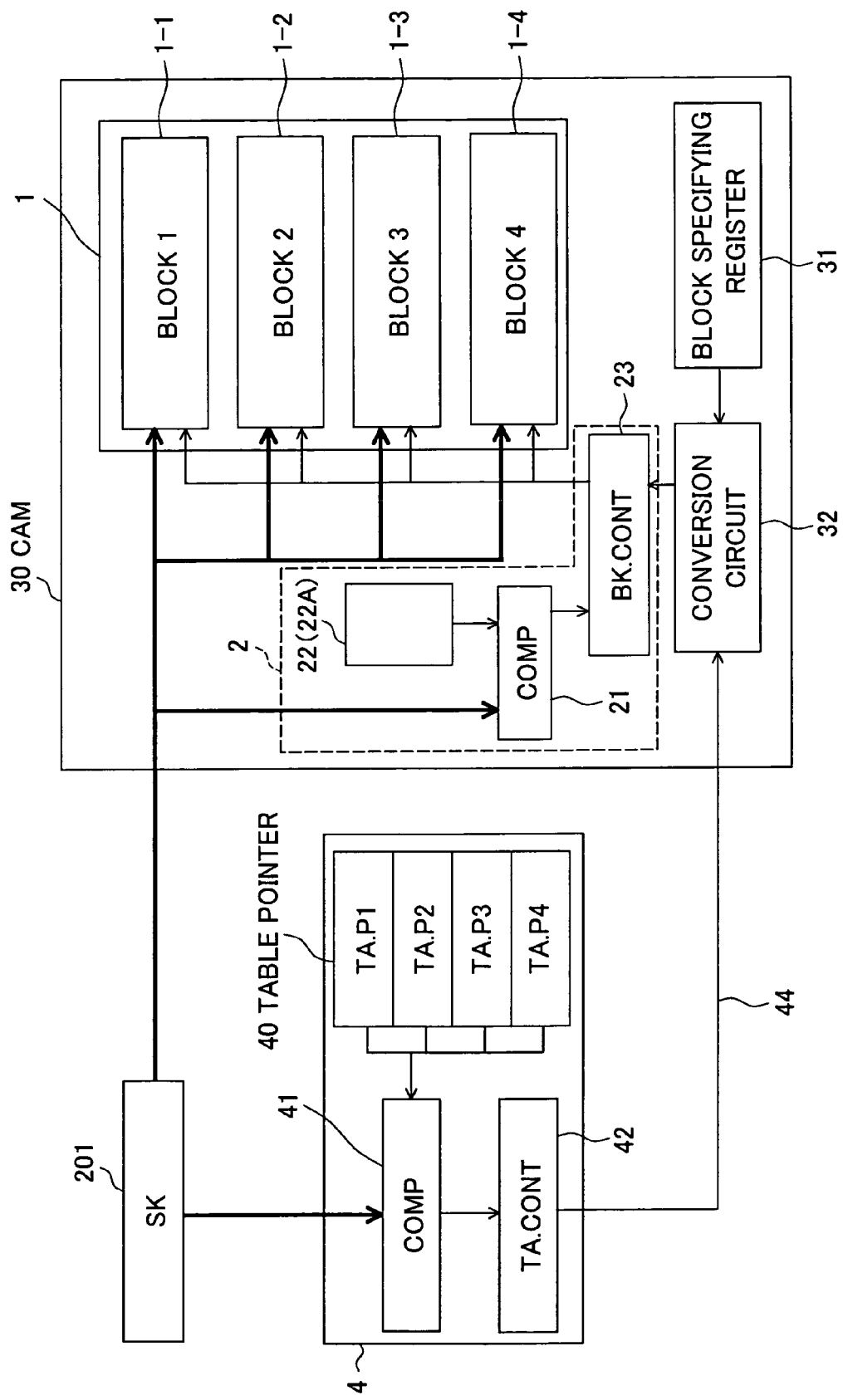
FIG. 8 is a block diagram of a modified example of the data retrieval device of the second embodiment.

FIG. 8 is a block diagram of the modified example.

The data retrieval device comprises as a common configuration with that of the first embodiment a pointer 22 (or 22A) as a "storage data range indication register" for holding information indicating a range of data size and a range comparator 21 as a "comparison specifying unit". The functions of these are the same as those in the first embodiment, so that an explanation will be omitted here. In this modified example, since a data storage range of storage data to be compared with retrieval data is searched from both the table and the range (size range), the accuracy is improved and controlling efficiency can be improved by narrowing down the broad data storage range by the table, and then, by specifying the data storage range by the range, etc.

In the above first and second embodiments, the below advantages can be obtained.

The CAM can be the cell configuration, for example, on a SRAM base, so that high speed data retrieving becomes possible.

In a CAM of the related art, data is stored only in a priority order (an order of the first processing significance degree) and not arranged based on a unique order (an order of the second significance degree) by which a judgment from the data itself is possible, and relationships between the retrieval data and storage data are completely unknown. Therefore, in the CAM of the related art, all CAM cells are driven at a time to search all ranges of the memory every time retrieval data is input.

In the present embodiment, the memory is divided to a plurality of memory blocks and only one memory block in principle, or two memory blocks depending on cases, which is low in probability in the normal memory block scale that one block holds several kilobytes of data, is driven. Therefore, the larger a memory capacity and the number of blocks, the larger the effect of reducing a power consumption.

For example, in a router on the server side for relaying, a mass of packets are processed in an extremely short time, so that power consumption increases. An increase of power consumption of a CAM chip causes erroneous operation due to heating and disturbs high-speed performance. This has been a bottleneck of pursuing higher integration of the CAM. In the present embodiment, a power consumption of the CAM can be reduced to less than half or by one digit or more, so that it is possible to dramatically improve the performance of such a large scale router, etc.

Note that in the above embodiments, an embodiment of algorithm base is also possible, wherein particularly the block selection controlling means, rearrangement means and assignment means of data are executed by a program in an exclusive or existing CPU, etc. In this case, processing at a further higher speed becomes possible.

Realization of the power-saving data retrieval device and a data transmission device using the same has become a significant social challenge today with a development of the Internet, and the trend spreads to the all over the world in the future, so that their industrial value is extremely high.

The present invention can be widely applied to use as a CAM with a large scale memory capacity and a variety of data retrieval devices and data transfer devices, such as a router, incorporating the same.

The embodiments explained above are for easier understanding of the present invention and are not to limit the present invention. Accordingly, respective elements disclosed in the above embodiments include all modifications in designs and equivalents belonging to the technical field of the present invention.

What is claimed is:

1. A data retrieval device, comprising:
    a rearrangement means, which applies a first rearranging of a first data group that includes a plurality of rule data arranged in an order of priority of the rule data, said first rearranging being a sequential ordering according to a numerical value of the rule data;
    an assignment means for grouping the rearranged first data group to provide a plurality of memory blocks composed of content addressable memory, the plurality of memory blocks respectively having an assigned range corresponding to the rearranged first data group, wherein said rearrangement means applies a second rearranging within each of the plurality of memory blocks, said second rearranging being a priority ordering according to said order of priority of the rule data; and
    a block selection means, for specifying one of the plurality of memory blocks to provide a specified memory block, wherein said specifying is based upon a comparison of input retrieval data to the assigned ranges of the plurality of memory blocks.

2. The data retrieval device of claim 1, wherein only the specified memory block is activated at the time of retrieval, with other blocks from the plurality of memory blocks not being activated, such that power consumption at the time of retrieving is reduced.

3. The data retrieval device as set forth in claim 2, further comprising a retrieval controlling unit that performs content address retrieving by comparing said input retrieval data to the assigned ranges of the plurality of memory blocks and outputs an address of said memory block hit by the content address retrieving.

4. The data retrieval device as set forth in claim 1, wherein the block selection means comprises:
    a storage data range indication register for indicating the assigned range corresponding to at least one the plurality of memory blocks; and
    a comparison specifying means for comparing the contents of the storage data range indication register with input retrieval data and specifying a memory range including a memory block storing data to be compared with the input retrieval data, wherein the block selection means activates at the time of retrieving the memory block storing data to be compared with the input retrieval data.

5. The data retrieval device as set forth in claim 4, further comprising a retrieval controlling unit that performs content address retrieving by comparing said input retrieval data to the assigned ranges of the plurality of memory blocks and outputs an address of said memory block hit by the content address retrieving.

6. The data retrieval device as set forth in claim 1, further comprising:
    a block specifying register for holding a combination of one or more of said plurality of memory blocks by relating to reference numbers, wherein the block selection means activates at least one memory block in accordance with a value stored in said block specifying register.

7. The data retrieval device as set forth in claim 6, further comprising a retrieval controlling unit that performs content address retrieving by comparing said input retrieval data to the assigned ranges of the plurality of memory blocks and outputs an address of said memory block hit by the content address retrieving.

8. The data retrieval device as set forth in claim 1, further comprising a retrieval controlling unit that performs content address retrieving by comparing said input retrieval data to the assigned ranges of the plurality of memory blocks and outputs an address of said memory block hit by the content address retrieving.

9. A data retrieval method, the method comprising:
    applying a first rearranging of a first data group that includes a plurality of rule data arranged in an order of priority of the rule data, said first rearranging being a sequential ordering according to a numerical value of the rule data;
    grouping the rearranged first data group to provide a plurality of memory blocks composed of content addressable memory, the plurality of memory blocks respectively having an assigned range corresponding to the rearranged first data group;
    applying a second rearranging within each of the plurality of memory blocks, said second rearranging being a priority ordering according to said order of priority of the rule data; and
    specifying one of the plurality of memory blocks to provide a specified memory block, wherein said specifying is based upon a comparison of input retrieval data to the assigned ranges of the plurality of memory blocks.

10. The method of claim 9, wherein only the specified memory block is activated at the time of retrieval, with other blocks from the plurality of memory blocks not being activated, such that a power consumption at the time of retrieving is reduced.

11. The method of claim 9, wherein specifying one of the plurality of memory blocks comprises providing a storage data range indication register for indicating the assigned range corresponding to at least one the plurality of memory blocks, comparing the contents of the storage data range indication register with input retrieval data and specifying a memory range including a memory block storing data to be compared with the input retrieval data, and activating at the time of retrieving the memory block storing data to be compared with the input retrieval data.

12. A data retrieval apparatus, the apparatus comprising:

a retrieval control unit, which applies a first rearranging of a first data group that includes a plurality of rule data arranged in an order of priority of the rule data, said first rearranging being a sequential ordering according to a numerical value of the rule data, and which groups the rearranged first data group to provide a plurality of memory blocks composed of content addressable memory, the plurality of memory blocks respectively having an assigned range corresponding to the rearranged first data group, and which applies a second rearranging within each of the plurality of memory blocks, said second rearranging being a priority ordering according to said order of priority of the rule data; and a block selection unit, in communication with the retrieval control unit, which specifies one of the plurality of memory blocks to provide a specified memory block, wherein said specifying is based upon a comparison of input retrieval data to the assigned ranges of the plurality of memory blocks.

13. The data retrieval apparatus of claim 12, wherein only the specified memory block is activated at the time of retrieval, with other blocks from the plurality of memory blocks not being activated, such that a power consumption at the time of retrieving is reduced.

14. The data retrieval apparatus of claim 12, wherein the block selection unit comprises:

a storage data range indication register for indicating the assigned range corresponding to at least one the plurality of memory blocks; and a comparison specifying unit for comparing the contents of the storage data range indication register with input retrieval data and specifying a memory range including a memory block storing data to be compared with the input retrieval data.

15. The data retrieval apparatus of claim 12, further comprising:

a block specifying register for holding a combination of one or more of said plurality of memory blocks by relating to reference numbers; and a block controlling unit for activating at least one memory block in accordance with a value stored in said block specifying register.

16. The data retrieval apparatus of claim 12, wherein the retrieval controlling unit performs content address retrieving by comparing said input retrieval data to the assigned ranges of the plurality of memory blocks and outputs an address of said memory block hit by the content address retrieving.

* * * * *

UNITED STATES PATENT AND TRADEMARK OFFICE
CERTIFICATE OF CORRECTION

| | |
|---|---|
| PATENT NO. | : 7,243,187 B2 |
| APPLICATION NO. | : 10/715352 |
| DATED | : July 10, 2007 |
| INVENTOR(S) | : Masato Yoneda |

It is certified that error appears in the above-identified patent and that said Letters Patent is hereby corrected as shown below:

Column 9:
Line 66 claim 4, "one the" should read -- one of the --.

Column 10:
Line 63 claim 11, "one the" should read -- one of the --.

Signed and Sealed this

Sixth Day of November, 2007

JON W. DUDAS
*Director of the United States Patent and Trademark Office*